United States Patent
Biber et al.

(10) Patent No.: US 8,148,983 B2
(45) Date of Patent: Apr. 3, 2012

(54) METHOD FOR CALIBRATION OF A MAGNETIC RESONANCE ACQUISITION CHANNEL, CALIBRATION DATA DETERMINATION DEVICE AND MAGNETIC RESONANCE SYSTEM

(75) Inventors: Stephan Biber, Erlangen/Frauenaurach (DE); Thorsten Speckner, Nuremberg (DE)

(73) Assignee: Siemens Aktiengesellschaft, Munich (DE)

( * ) Notice: Subject to any disclaimer, the term of this patent is extended or adjusted under 35 U.S.C. 154(b) by 364 days.

(21) Appl. No.: 12/535,784

(22) Filed: Aug. 5, 2009

(65) Prior Publication Data

US 2010/0033180 A1    Feb. 11, 2010

(30) Foreign Application Priority Data

Aug. 5, 2008 (DE) .......................... 10 2008 036 496

(51) Int. Cl.
*G01V 3/00* (2006.01)
(52) U.S. Cl. ....................................... 324/309; 324/318
(58) Field of Classification Search ........... 324/300–322
See application file for complete search history.

(56) References Cited

U.S. PATENT DOCUMENTS

| 5,172,059 A | 12/1992 | Den Boef |
| 6,977,502 B1 | 12/2005 | Hertz |

OTHER PUBLICATIONS

"Identification and Compensation of Nonlinear Distortion," Tsimbinos, University of South Australia, Institute for Telecommunications Research, School of Electronic Engineering, Doctoral Thesis (1995).

*Primary Examiner* — Dixomara Vargas
(74) *Attorney, Agent, or Firm* — Schiff Hardin LLP

(57) ABSTRACT

In a method for calibration of a magnetic resonance acquisition channel having a magnetic resonance acquisition antenna in a magnetic resonance system, in a test signal is emitted by the transmission antenna in the magnetic resonance system and is received by the acquisition antenna. Acquisition channel calibration data for the appertaining magnetic resonance acquisition channel are determined on the basis of the received test signal. The method can be implemented by a calibration data determination device for a magnetic resonance system as well as by a magnetic resonance system itself.

14 Claims, 3 Drawing Sheets

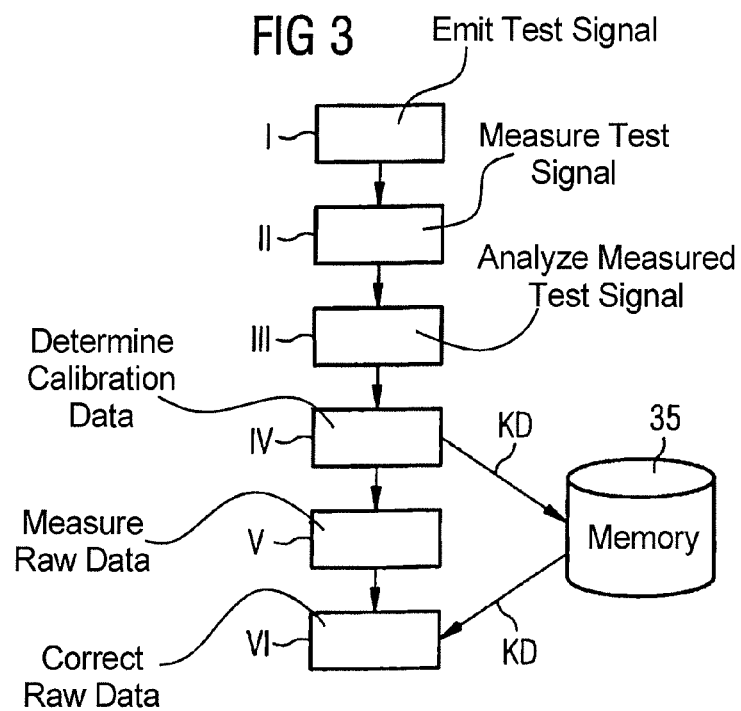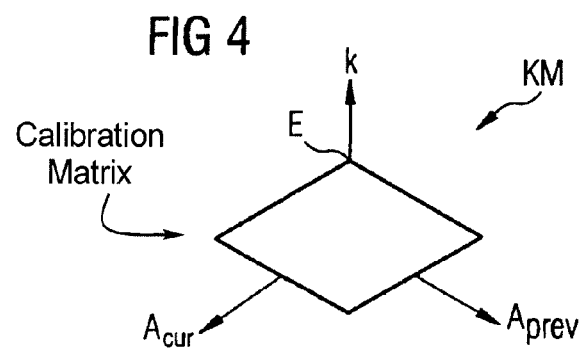

METHOD FOR CALIBRATION OF A MAGNETIC RESONANCE ACQUISITION CHANNEL, CALIBRATION DATA DETERMINATION DEVICE AND MAGNETIC RESONANCE SYSTEM

BACKGROUND OF THE INVENTION

1. Field of the Invention

The invention concerns a method for calibration of a magnetic resonance acquisition channel possessing a magnetic resonance acquisition antenna in a magnetic resonance system. Moreover, the invention concerns a calibration data determination device for a magnetic resonance system, as well as a magnetic resonance system.

2. Description of the Prior Art

Magnetic resonance tomography has become a widespread method for the acquisition of images of the inside of a body. In this method, the body to be examined is exposed to a relatively strong basic magnetic field, for example of 1.5 Tesla or, in newer systems (known as "high magnetic field systems"), of 3 Tesla or even more (presently 7 Tesla and 11 Tesla). A radio-frequency excitation signal (known as the $B_1$ field) is then emitted with a suitable antenna device, which causes the nuclear spins of specific atoms excited to resonance by this radio-frequency field to be tilted by a specific flip angle relative to the magnetic field lines of the basic magnetic field. The radio-frequency signal (known as the magnetic resonance signal) radiated upon relaxation of the nuclear spins is then detected with suitable antenna arrangements (called "magnetic resonance antenna arrangements" in the following). The raw data so acquired are used to reconstruct the desired image data. For spatial coding, defined magnetic field gradients are superimposed on the basic magnetic field during the transmission and the readout or acquisition of the radio-frequency signals.

Today images with high signal-to-noise ratio are normally acquired with antennas in the form known as local coils. The local coils can be executed as loop antennas or as butterfly antennas, for example. Stripline antennas are also used in high field systems. Generally, multiple local coils are used in parallel that individually supply the signal acquired by them to the acquisition electronics via separate acquisition channels.

FIG. 1 schematically shows a design for two such parallel acquisition channels 10. The voltage signal induced in the coil 11 by a magnetic resonance signal is amplified with a low-noise preamplifier 12 (generally designated as an LNA) and is finally relayed to the acquisition electronics 16 via cables 13, 15. High field systems are used to improve the signal-to-noise ratio, even in high-resolution images. Their basic field strengths are presently 3 Tesla or more. Theoretically, a quadrupling of the received power (i.e. an increase by 6 database) results with a doubling of the basic field strength. While maximum signal powers of only −27 dBm typically occur at the input of the preamplifier at 1.5 Tesla, these are already typically −21 dBm at maximum at 3 T. The preamplifier must operate with nearly no distortion in the entire range of the powers, i.e. from thermal noise up to the maximum MR signal. This is still possible only to a limited extent in the high maximum powers that occur in high field systems. Therefore, often at least one additional, switchable amplifier 14 (most often an RCCS SGA=Receive Coil Channel Selector Switchable Gain Amplifier) operates in the further acquisition chain to mitigate the dynamic requirements, which additional amplifier 14 at the same time also forms a switching arrangement to switch over the antenna to different inputs of the acquisition electronics 16. The RCCS SGA 14 and the acquisition electronics 16 are thus respectively fashioned as joint apparatuses for multiple parallel acquisition channels 10, which is different than is shown in FIG. 1. For signals with lower maximum power, the amplifier 14 is switched by a switching signal S so that the amplifier additionally amplifies. Given very strong signals, the amplifier 14 is switched so that only a small amplification or no additional amplification occurs. The noise factor of the acquisition chain in the small signal case is therefore normally much better than in the large signal case because a higher amplification minimizes the contribution of what is known as the "backend" (the cable 15 and the acquisition electronics 16) to the total noise factor.

Switchable amplifiers 14 have previously been connected in the acquisition chain only after the LNA 14 since a switchable amplifier is possible only at the expense of poorer noise adaptation (increased LNA noise). In order to be able to precisely determine the absolute gain of the RCCS SGA 14 for both states (high gain and low gain), a calibration of the crossover switch must occur. For this the amplification of the RCCS SGA 14 is presently measured via a test signal in that a signal with defined signal level is fed in at the input of the RCCS SGA 14. This occurs hardware outlay due to the need to switch the test signals to all possible input paths of the RCCS SGA 14. For a theoretically possible amplification switch-over at the input of the first preamplifier 12 of the acquisition chain (indicated as an option by the dashed-line arrows in FIG. 1), the test signal would have to be transferred through the entire acquisition chain, starting from the output of the local coil 11 itself. This would be connected with a very high wiring and switching cost.

SUMMARY OF THE INVENTION

An object of the present invention is to provide an improved arrangement for calibration of a magnetic resonance acquisition channel.

In the method according to the invention, a test signal is emitted by a transmission antenna in the magnetic resonance system. The test signal is then received by the acquisition antenna. Instead of the test signal thus being directly fed into the local coil by an electrical connection, a signal is induced in the appertaining acquisition antenna via an inductive coupling with the transmission coil that is used. Acquisition channel calibration data for the appertaining magnetic resonance acquisition channel are then determined on the basis of the received test signal, and a calibration of the magnetic resonance acquisition channel can then ensue later based on this. The induction of the test signal by means of a transmission antenna has the advantage that no additional conductors or switching costs are required in order to feed a test signal into the magnetic resonance acquisition channel, and in addition all nonlinearities which can occur in the various different components along the complete magnetic resonance acquisition channel can be detected with one measurement, and corresponding acquisition channel calibration data can be generated in order to calibrate the magnetic resonance acquisition channel as a whole. To feed in the test signal, only the acquisition coil must be set so that it is receiving during the emission of the test signal.

A calibration determination device according to the invention initially requires a test signal initiation unit which initiates an emission of the test signal, for example via a typical transmission channel and an antenna located in the magnetic resonance apparatus anyway (such as the whole-body antenna). Furthermore, the calibration data determination device requires a test signal acquisition interface to detect a test signal received via the magnetic resonance acquisition channel. Such a test signal acquisition interface advantageously accesses the measurement data acquired by the acquisition channel in digital form, meaning that it is only connected after an analog-digital converter for the respective measurement signal in the acquisition device, for example. Existing analog receivers can thus be used as well. Furthermore, the calibration data determination device according to the invention possesses a test signal analysis unit in order to determine acquisition channel calibration data for the appertaining magnetic resonance acquisition channel on the basis of an acquired test signal. These acquisition channel calibration data are then stored in a memory for later use by means of a storage device of the calibration data determination device. For example, the storage device can be an output interface via which the data can be stored in a memory that can also be used by other components, or a separate memory of the calibration data determination device with corresponding means in order to write the data into the memory.

A magnetic resonance system to implement the method according to the invention has a scanner unit with a magnetic resonance measurement chamber and a transmission antenna in order to emit a radio-frequency signal into the magnetic resonance measurement chamber. Furthermore, the magnetic resonance system has a control device to control the scanner unit as well as a number of magnetic resonance acquisition channels with respective associated magnetic resonance acquisition antennas in order to receive magnetic resonance signals. According to the invention, a calibration data interface is provided in order to accept acquisition channel calibration data for the individual magnetic resonance acquisition channels, for example to retrieve them from a memory in which these have previously been stored by the calibration data determination device. The magnetic resonance system has a correction unit in order to implement a correction of measurement data acquired by the appertaining magnetic resonance acquisition channel based on acquisition channel calibration data received for a magnetic resonance acquisition channel.

In principle, it is possible for the magnetic resonance system to access calibration data previously determined in other systems for the respective acquisition channels. For example, such calibration data could already have been determined at the manufacturer and been stored in a memory in the control device of the magnetic resonance system so that these can then be used by the correction unit. However, the magnetic resonance system itself preferably has a calibration data determination device according to the invention in order to be able to conduct the calibration at any time in the magnetic resonance system and thus to generate current calibration data (for example immediately) for subsequent measurements.

A variety of different nonlinearities in the magnetic resonance acquisition channel can be taken into account with the aid of the calibration method according to the invention.

This particularly pertains to the already aforementioned switching over between a high amplification and a low amplification of an amplifier device in the magnetic resonance acquisition channel. For this an amplifier device—for example the RCCS or, insofar as the preamplifier can likewise be switched, even the preamplifier, or even both amplifiers in the acquisition chain—can be switched during the measurement of the test signal. This means that the amplifier device or, respectively, devices can simply be switched between a "high gain" mode and "low gain" mode (high amplification mode and low amplification mode) given a fixed transmission power of the test signal, and thus the gain difference between high gain and low gain can be established in that the signal power and/or phase of the test signal measured before and after the switch is respectively determined.

Furthermore, during a measurement of the test signal the power of the test signal can be varied (for example be increased or reduced in steps or continuously) in order to thus acquire a linearity curve via measurement of the test signal output power depending on the test signal input power. Alternatively or additionally, it is also possible to vary the frequency of a test signal in steps or continuously during a measurement of said test signal. Not only the gain stepping necessary to realize the high dynamics but also the frequency response or, respectively, frequency curve of the complete magnetic resonance acquisition channels can thus be characterized in the calibration measurements.

The acquisition channel calibration data determined in all of these different measurements can advantageously respectively contain correction values with which measurement values acquired via the appertaining magnetic resonance channel are corrected for calibration in a later measurement. The correction values can be, for example, correction factors, offset values or already finished, corrected measurement values to be exchanged for the measurement values to be calibrated. As explained above, for this these acquisition channel calibration data are initially stored in a memory in which they can then be retrieved again as needed upon implementation of a measurement.

In particular, these acquisition channel calibration data can in the simplest case comprise correction values for different amplification stages of an amplification device of the magnetic resonance acquisition channel, thus for example a correct value (in particular correction factor) for switching between high gain and low gain mode in the acquisition channel.

The acquisition channel calibration data preferably comprise a calibration matrix in which correction values are stored for various different frequency values and/or various current signal power values of an acquired measurement signal. In a simple case, a calibration curve is thereby recorded depending on the frequency of an acquired magnetic resonance signal or depending on its signal power.

This matrix is advantageously multidimensional, meaning that one correction value is determined and stored for the respective current frequency value and the signal power value, for example.

The typical magnetic resonance acquisition channel is of the type known as a "memory-dependent system. A "memory-dependent" system is a system in which, given operation of the system, the system response at a point in time $t_0$ also depends on the system state at a preceding point in time $t_0$-$t_1$. In particular in such memory-dependent, nonlinear systems in which an error (i.e. a deviation from the linearity) depends not only on the current state of the signal (i.e. its current frequency and/or power) but also on signal states at preceding points in time, it is advantageous to determine a calibration matrix which contains different correction values depending on signal states at a number n=1, 2, 3, . . . of past defined points in time. For example, an (n+2)-dimensional matrix could be constructed in which, the correction values are entered depending on the current frequency and depending on a current signal power value, but also depending on the signal power values at n points in time defined in the past. The points in time can respectively be defined by the sample rate with which the analog signal is sampled upon digitization.

In addition to the methods explained above for the use of error tables or error matrices, in principle analytical methods can also be used in order to implement a suitable calibration, i.e. to determine matching calibration data. For example, the use of Volterra series is advantageous in order to achieve a combination of the nonlinearities, wherein the linearity curves and frequency responses detected with the method according to the invention can be used as input data for these Volterra series, for example. Many different methods for correction of nonlinear, memory-dependent systems (among which are also the magnetic resonance acquisition channels in magnetic resonance systems) are known to those skilled in the art. A good description of these is found in, for example, the dissertation by John Tsimbinos, "Identification and Compensation of nonlinear Distortion", Institute for Telecommunications Research, School of Electronic Engineering, University of South Australia.

In principle, special test signal transmission antennas can be used to emit the test signals. However, in a preferred variant, antennas that are present anyway in the magnetic resonance system are used. For example, the test signal can be emitted via the whole-body coil of the magnetic resonance system for the calibration of magnetic resonance acquisition channels of local coils. Alternatively, one of the pick-up antennas that is normally integrated into the whole-body coil can also be used. These otherwise serve to acquire a $B_1$ field emitted by the whole-body coil, and via this to then determine the emitted field strength of the magnetic resonance coil. In an application according to the invention, the test signal initiation unit thus would merely have to be connected with a whole-body coil and/or a pick-up antenna of the magnetic resonance system and be fashioned so that the test signal can be emitted via this whole-body coil and/or a pick-up antenna.

With regard to the whole-body coil, it would be sufficient if the test signal initiation unit transmits a corresponding command to the typical transmission device which otherwise provides for a matching emission of the $B_1$ field for the magnetic resonance measurement. Care must then be taken that the transmission power of the test signal in the measurements is kept low so that the acquisition components in the magnetic resonance acquisition channel can be controlled in a linear range in order to also check the small signal response.

Given the use of a pick-up loop to emit the test signal, this would have to be provided with a crossover switch in order to be able to switch between the pick-up coils for the measurement of the $B_1$ field emitted by the whole-body coil to a test signal generator for an emission of the test signal. The test signal generator is then in turn controlled by the test signal initiation unit.

A test signal emitted by a transmission coil is advantageously simultaneously received by acquisition antennas of multiple magnetic resonance acquisition channels and used to determine acquisition channel calibration data for the appertaining magnetic resonance acquisition channels. Complete arrays of local coils can thereby be measured significantly faster.

All measurements can be conducted both in an unloaded magnetic resonance system and in a loaded magnetic resonance system—i.e. when a patient is located in the measurement chamber of the magnetic resonance system. In particular, an emission of test signals and determination of acquisition channel calibration data for different loading situations of the magnetic resonance system can also ensue. Calibration data can then be determined and stored in advance for different patient types. An individual acquisition of patient-specific calibration data that, for example, are determined just before a magnetic resonance measurement, are then stored for this patient and are used for calibration in the further measurements is likewise also possible. In this way it is possible to implement not only a hardware-dependent measurement but also a patient-dependent measurement of the frequency curve of the entire acquisition system within the entire magnetic resonance bandwidth in order to thus be able to implement a post-compensation or, respectively, an equalization of the acquisition system. Corresponding measurements can also likewise be implemented to determine patient-dependent linearity power curves. Dependencies of the transmission amplitude on the respective load situation of the transmission coil and its performance can be picked up in these measurements by a pick-up coil (in its otherwise typical mode of operation) and be taken into account in the calculations of the calibration data.

BRIEF DESCRIPTION OF THE DRAWINGS

FIG. 3 is a flow chart for an embodiment of a workflow of a method according to the invention.

FIG. 4 is a schematic representation of a calibration matrix for use in the method according to the invention.

DESCRIPTION OF THE PREFERRED EMBODIMENTS

Figure 1:
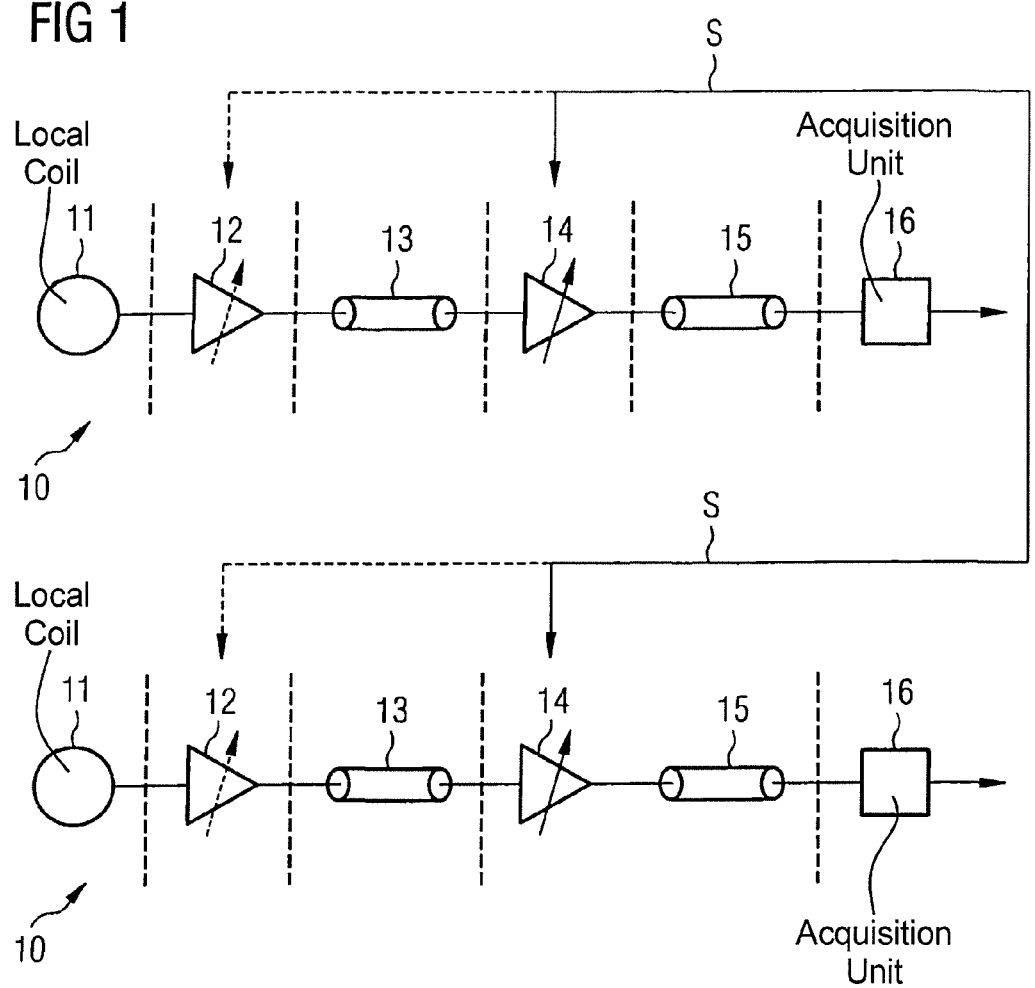
FIG. 1 is a schematic representation of two parallel magnetic resonance acquisition channels.

The typical design of a magnetic resonance acquisition channel that is schematically shown in FIG. 1 was explained in detail above.

Figure 2:
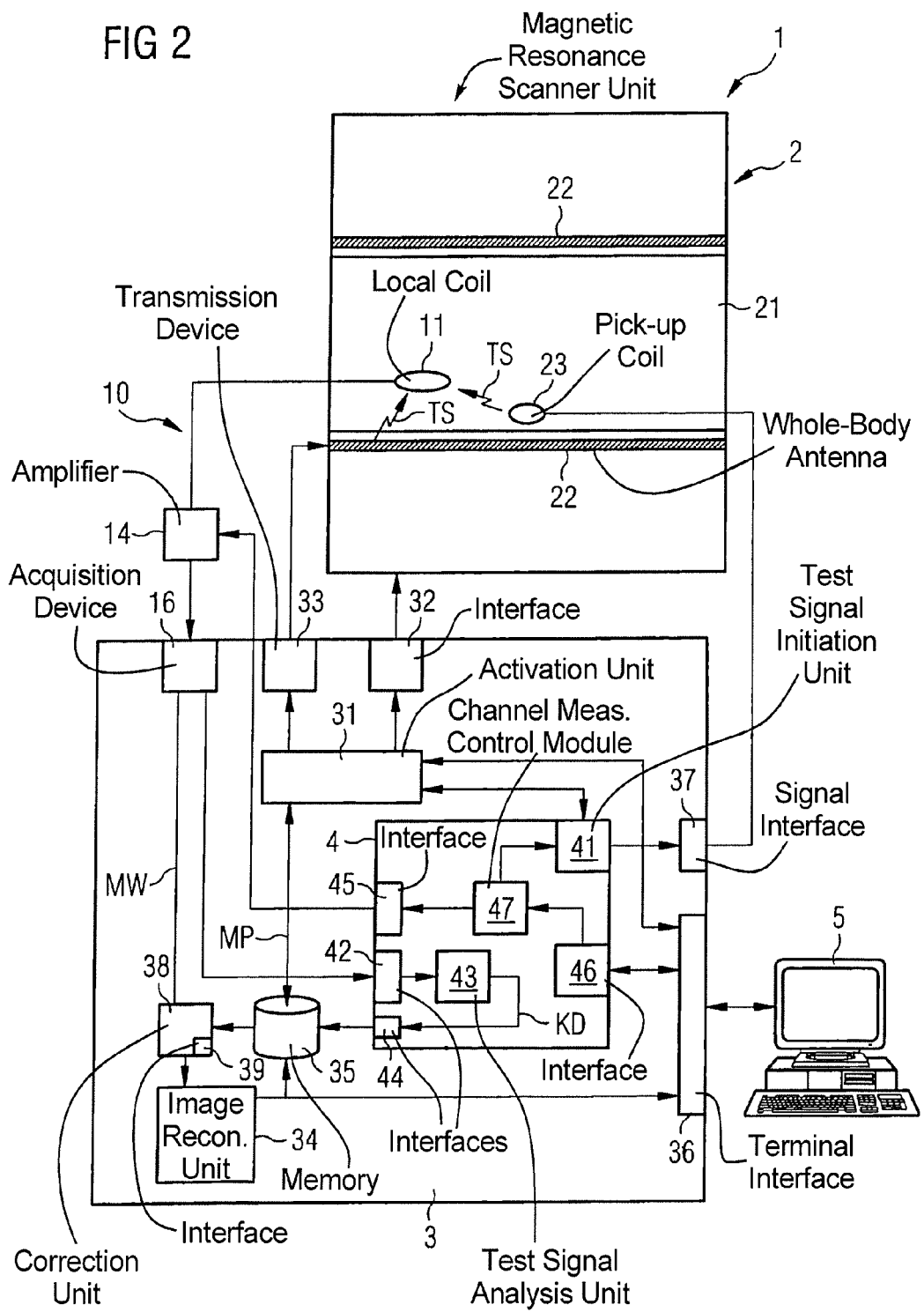
FIG. 2 is a schematic representation of an exemplary embodiment of a magnetic resonance system according to the invention.

FIG. 2 shows in rough schematic a magnetic resonance system 1 according to the invention which possesses, among other things, multiple magnetic resonance acquisition channels as presented in FIG. 1.

The magnetic resonance system 1 according to the invention on the one hand comprises the actual magnetic resonance scanner unit 2 in which a patient or test subject is borne on a patient bed in a magnetic resonance measurement chamber 21 or patient tunnel during an examination. There are a number of components in this magnetic resonance scanner unit 2. These components include a basic magnetic field generation unit that ensures that an optimally homogeneous basic magnetic field is present within the patient tunnel. Furthermore, the magnetic resonance scanner unit contains gradient coils with which a magnetic field gradient can be applied in a defined manner within the patient tunnel, as well as a whole-body antenna 22 with which the radio-frequency fields (the $B_1$ field) can be emitted in the patient runnel 21. These radio-frequency fields then typically serve to induce magnetic resonance signals in the tissue of the examination subject.

Since the components of such a magnetic resonance scanner unit 2 are known to those skilled in the art, in FIG. 2 only the component that is essential to the invention (namely the whole-body antenna 22 arranged around the magnetic resonance measurement chamber 21) is schematically shown in FIG. 2, for clarity. Such a whole-body antenna is normally designed as a birdcage antenna or saddle coil. As already mentioned, for the most part one or more pick-up coils 23 which typically serve to measure the radio-frequency fields emitted by the whole-body coil 22 in order to determine the $B_1$ field strength are installed inside the whole-body antenna 22.

The magnetic resonance scanner unit 2 is controlled by means of a control device 3. Here as well only the components of this control device 3 that are essential to the invention are schematically shown since the design of such a control device is likewise known to those skilled in the art.

This control device 3 is connected via a transmission device 33 with the whole-body antenna 22. The radio-frequency pulses that are then emitted by the whole-body coil 22 are generated via the transmission device 33, which can have one transmission channel or multiple transmission channels. The components (not shown) of the magnetic resonance scanner unit 2 (for example the gradient coils) can be controlled via additional interfaces of the control device 3. All of these interfaces here are combined into one interface block 32.

An activation unit 31 which can be installed in the control device (for example in the form of software on a processor) provides that a specific sequence of radio-frequency pulses and gradient pulses is emitted and a specific basic magnetic field is applied by the transmission device 33 or the interface(s) 32 for a magnetic resonance measurement. The workflow of the measurement is thereby determined by a measurement protocol MP which (for example) is stored in a memory 35 of the control device 3 and can be retrieved and modified by an operator via a control terminal 5 that is connected to the control device 3 via a terminal interface 36. A precise planning of the measurement in advance is thus possible with the aid of this measurement protocol MP. The actual measurements then ensue wholly automatically on the basis of the measurement protocol MP.

The data induced in such a measurement are acquired, for example, with the local coil 11 of the magnetic resonance acquisition channel 10 and relayed back to the control device 3 via the magnetic resonance acquisition channel 10. The magnetic resonance acquisition channel 10 was already explained using FIG. 1. Only the local coil 11, a switchable amplifier (RCCS SGA) 14 and the acquisition electronics 16 (also called an acquisition unit in the following; indicated here as part of the control device 3) are shown in this Figure. The preamplifier LNA is normally directly integrated into the local coil 11 and therefore is not drawn separately here.

A magnetic resonance system 1 normally has a number of parallel magnetic resonance acquisition channels 10. For simplicity's sake, here only one channel is drawn as a representative. The raw data acquired by the acquisition unit 16 via the magnetic resonance acquisition channel 10 are digitized in said acquisition unit 16 and transmitted in digital form as measurement values to an image reconstruction unit 34. The image data generated therein can then be stored in a memory 35 or be output via the terminal interface 36 on a screen of the control terminal 5. Such a control device 3 normally also have a connection to a network (not shown here) so that the image data can also be stored in external mass storage, or be viewed on additional finding stations connected to the network, or, respectively, be output at other output stations such as printers or monitors.

The image reconstruction device 34, like the activation device 31, is normally realized in the form of software on a processor of the control device 3, wherein such a control device 3 naturally possesses not just one but normally multiple processors networked among one another.

According to the invention, the control device 3 here moreover possesses a calibration data determination device 4 which can likewise be realized in the form of software. The calibration data determination device 4 on the one hand possesses a channel measurement control module 47. for example, an emission of one or more test signals TS is prompted by this channel measurement control module, for example via a test signal initiation unit 41. This can on the one hand ensue via the activation unit 31 which provides that a test signal TS is emitted via the whole-body coil 22. However, it is also possible to emit a test signal TS via a pick-up coil 23 over a signal interface 37.

This test signal TS is then detected by the local coil 11 and can be tapped in the acquisition unit 16 again in digital form via a test signal acquisition interface 42 of the calibration data determination device 4. The test signal detected by the test signal acquisition interface 43 is then analyzed in a test signal analysis unit 43 in order to determine acquisition calibration data KD for the appertaining magnetic resonance acquisition channel 10 via which the test signal TS was acquired. These acquisition channel calibration data KD can then be stored in a memory 35 (for example) via an output interface 44 in order to be drawn upon in later measurements for calibration of the acquisition channel 10.

As already explained, a variety of different test measurements can be conducted in order to determine various calibration data KD. For example, the channel measurement control module 47 can ensure via a switching interface 45 that the preamplifier (RCCS) 14 and possibly also the LNA preamplifier in the local coil 11 are switched from a high gain mode to a low gain mode or vice versa while the test signal TS is emitted and received. The calibration for the high gain/low gain switching can then be derived very simply from the difference of the signals (i.e. of the amplitude and the phase before and after the switching), and corresponding values can be stored in memory 35. The channel measurement control module 47 can likewise ensure that the frequency and/or the power of the test signal is varied during a measurement in order to determine the power linearity curve and/or a frequency response of the respective magnetic resonance acquisition channel and to acquire corresponding calibration curves for these. The measurement can also be controlled or, respectively, initiated from the terminal via the terminal interface 36 connected with an interface 46 of the calibration data determination device 4.

For example, the calibration data can be used by a correction unit 38 that reads these data from the memory 35 by means of a correction data interface 39 and then uses them in order to correct measurement values MW acquired by the acquisition device 16 in a later measurement and to pass these as corrected measurement values MW' to the image reconstruction unit 34 so that this receives already-calibrated data, and thus the reconstructed images exhibit a higher quality.

FIG. 3 shows an overview of the possible method workflow. A test signal is thereby initially emitted (Method Step I) in a calibration phase that includes Steps I through IV, and this test signal is measured in parallel (Method Step II). This measured test signal can then be analyzed in Method Step III, and from this calibration data are determined in Method Step IV and stored in memory 35. The actual measurement of the raw data first ensues in Method Step V in a later measurement that includes Method Steps V and VI, which raw data (in the form of digital measurement values MW) are then corrected in Step VI on the basis of the previously stored calibration data KD and provided as calibrated measurement values MW'.

As also explained above, the magnetic resonance acquisition channel is normally a nonlinear, memory-afflicted system in which, given a nonlinear gain, the measurement value at a concrete point in time $t_0$ depends not only on the current state of the individual components in the magnetic resonance acquisition channel 10 but also on the states at previous points in time $t_0$-$t_1$, $t_0$-$t_2$, …. This is due to the fact that the magnetic resonance acquisition channel is a band-limited system.

In principle, analytical methods (for example Volterra series) can be used in such systems in order to implement a calibration of the measurement values on the basis of the curves acquired with the aid of the measurement according to the invention. However, error tables or, respectively, error matrices (calibration matrices) are preferably used for calibration. Such a calibration matrix KM is schematically presented in FIG. 4 for a very simple case. There a correction factor K is plotted over a plane that is spanned by the current amplitude $A_{cur}$ of the acquired radio-frequency power and by an amplitude $A_{prev}$ of the radio-frequency power at a preceding point in time. However, a more than three-dimensional matrix is advantageously used, wherein the frequency of the magnetic resonance signal can be taken into account via an additional dimension, for example, and/or additional dimensions are spanned by system states present before the current state, for example signal power amplitudes or frequencies existing at specific previous points in time.

In order to be able to generate such a calibration matrix KM as quickly as possible, a calibration measurement is advantageously implemented very quickly in succession [sic] with various test signals, wherein different curve shapes for the test signal are used.

In order to avoid the calibration matrices being too large, a threshold (this is a plane E in the three-dimensional case in FIG. 4) as of which the magnetic resonance acquisition channel behaves increasingly nonlinearly is advantageously established, as this is schematically presented in FIG. 4. For values below this level, no calibration is conducted in the manner described here, and the values are retroactively corrected only above such a threshold (for example a power threshold).

In the above example, it is assumed that respective correction factors with which the measured value is corrected again (for example) are stored in the tables. However, in principle the finished, corrected values can also already be stored for specific values, such that these can simply be swapped out.

Overall the method according to the invention thus offers a very simple possibility to implement a complete calibration of the acquisition channels, wherein test signal lines realized in hardware form and an associated circuit are not required; rather, already existing systems can also be modified via corresponding software updates so that these can be operated in the manner according to the invention.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for calibrating a magnetic resonance acquisition channel in a magnetic resonance system, comprising:
    from a magnetic resonance antenna system of the magnetic resonance system, radiating a test signal and, with said antenna system, detecting the test signal, as a received test signal;
    in a processor, automatically determining acquisition channel calibration data for said acquisition channel from said received test signal; and
    automatically calibrating said acquisition channel using said acquisition channel calibration data.

2. A method as claimed in claim 1 wherein said magnetic resonance acquisition channel comprises an amplifier device therein, and wherein said method comprises emitting said test signal and detecting said received test signal in a test measurement session, and switching said amplifier among different amplification levels during said test measurement session.

3. A method as claimed in claim 1 comprising emitting said test signal and detecting said received test signal in a test measurement session, and varying a power of said test signal during said test measurement session.

4. A method as claimed in claim 1 comprising emitting said test signal and detecting said received test signal in a test measurement session, and varying a frequency of said test signal during said test measurement session.

5. A method as claimed in claim 1 comprising emitting said test signal and detecting said received test signal in a test measurement session and, in said test measurement session, generating, as said acquisition channel calibration data, correction values that serve to correct magnetic resonance image data that proceed through said acquisition channel in a diagnostic magnetic resonance examination following said test measurement session.

6. A method as claimed in claim 5 wherein said acquisition channel comprises an amplifier device, and comprising generating said correction values as values that set respective amplification levels of said amplifier device.

7. A method as claimed in claim 5 comprising, from said processor, electronically storing said correction values in a calibration matrix in which each correction value is correlated with at least one signal characteristic of a magnetic resonance signal representing said magnetic resonance image data, selected from the group consisting signal frequency and signal power.

8. A method as claimed in claim 7 comprising storing, in said calibration matrix, different correction values dependent on said at least one signal characteristic for respectively different past points in time.

9. A method as claimed in claim 1 wherein said magnetic resonance apparatus comprises a plurality of acquisition channels and wherein said antenna system comprises a plurality of acquisition antennas respectively connected to said acquisition channels, and comprising detecting a received test signal with each of said detection antennas, and generating calibration data for each of said acquisition channels from the respective received test signals.

10. A method as claimed in claim 1 comprising emitting said test signal and detecting said received test signal in a test measurement session, and emitting said test signal and detecting said received test signal in an examination volume of the magnetic resonance apparatus, and loading the examination volume during said test measurement session.

11. A method as claimed in claim 10 comprising differently loading said examination volume during said test measurement session.

12. A calibration data determination processor for calibrating a magnetic resonance acquisition channel in a magnetic resonance system, comprising:
    a test signal initiation unit that causes a magnetic resonance antenna system of the magnetic resonance system to radiate a test signal;
    a test signal acquisition interface connected to said antenna system that receives, from said antenna system, the test signal detected by said antenna system, as a received test signal;
    a test signal analysis unit that automatically determines acquisition channel calibration data for said acquisition channel from said received test signal; and
    a memory in which said calibration data are stored in a form accessible for calibrating said acquisition channel using said acquisition channel calibration data.

13. A magnetic resonance system comprising:
an antenna system that radiates RF signals into a subject and that receives magnetic resonance diagnostic signals resulting therefrom;
an acquisition channel in which said magnetic resonance diagnostic signals are received from said antenna system;
a control unit that operates said antenna system to radiate a test signal and, with said antenna system, to detect said test signal as a received test signal;
a processor that automatically determining acquisition channel calibration data for said acquisition channel from said received test signal; and
a correction unit that automatically calibrates said acquisition channel using said acquisition channel calibration data.

14. A magnetic resonance system as claimed in claim 13 comprising a whole body antenna and a local coil, and wherein said control unit is connected to said whole body coil and to said local coil and is configured to selectively cause said test signal to be radiated by either of said whole body coil or said local coil.

* * * * *